United States Patent
Zhang et al.

(10) Patent No.: US 9,299,745 B2
(45) Date of Patent: Mar. 29, 2016

(54) INTEGRATED CIRCUITS HAVING MAGNETIC TUNNEL JUNCTIONS (MTJ) AND METHODS FOR FABRICATING THE SAME

(71) Applicant: GLOBALFOUNDRIES, Inc., Grand Cayman (KY)

(72) Inventors: Xunyuan Zhang, Albany, NY (US); Sean Xuan Lin, Watervliet, NY (US); Kunaljeet Tanwar, Fremont, CA (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 14/272,916

(22) Filed: May 8, 2014

(65) Prior Publication Data

US 2015/0325622 A1    Nov. 12, 2015

(51) Int. Cl.
| | |
|---|---|
| *H01L 21/02* | (2006.01) |
| *H01L 27/22* | (2006.01) |
| *H01L 43/12* | (2006.01) |
| *H01L 43/08* | (2006.01) |
| *H01L 43/02* | (2006.01) |

(52) U.S. Cl.
CPC ............ *H01L 27/222* (2013.01); *H01L 43/02* (2013.01); *H01L 43/08* (2013.01); *H01L 43/12* (2013.01)

(58) Field of Classification Search
CPC ....... H01L 43/12; H01L 43/02; H01L 27/222; H01L 27/228; G11C 11/161
USPC ............................................... 257/295; 438/3
See application file for complete search history.

(56) References Cited

U.S. PATENT DOCUMENTS

| | | | |
|---|---|---|---|
| 2006/0146599 A1* | 7/2006 | Amano | G11C 11/15 365/158 |
| 2006/0170068 A1* | 8/2006 | Ren et al. | 257/421 |
| 2010/0224920 A1* | 9/2010 | Lee | 257/295 |
| 2012/0228685 A1* | 9/2012 | Kim | 257/295 |
| 2012/0261779 A1* | 10/2012 | Kajiyama | G11C 11/16 257/427 |
| 2013/0241037 A1* | 9/2013 | Jeong et al. | 257/536 |

* cited by examiner

*Primary Examiner* — Tu-Tu Ho
(74) *Attorney, Agent, or Firm* — Ingrassia Fisher & Lorenz, P.C.

(57) ABSTRACT

Integrated circuits with magnetic tunnel junction (MTJ) structures and methods for fabricating integrated circuits with MTJ structures are provided. An exemplary method for fabricating an integrated circuit includes forming a first conductive line in electrical connection with an underlying semiconductor device. The method exposes a surface of the first conductive line. Further, the method selectively deposits a conductive material on the surface of the first conductive line to form an electrode contact. The method includes forming a MTJ structure over the electrode contact.

18 Claims, 6 Drawing Sheets

INTEGRATED CIRCUITS HAVING MAGNETIC TUNNEL JUNCTIONS (MTJ) AND METHODS FOR FABRICATING THE SAME

TECHNICAL FIELD

The technical field generally relates to integrated circuits and methods for fabricating integrated circuits, and more particularly relates to integrated circuits and methods for fabricating integrated circuits having magnetic tunnel junctions (MTJs).

BACKGROUND

Unlike conventional random access memory (RAM) chip technologies, magnetic RAM (MRAM) does not store data as electric charge, but instead stores data by magnetic polarization of storage elements. Typically, storage elements are formed from two ferromagnetic layers separated by a tunneling layer. One of the ferromagnetic layers has at least one pinned magnetic polarization (or fixed layer) set to a particular polarity. The magnetic polarity of the other ferromagnetic layer (or free layer) is altered to represent either a "1" (i.e., anti-parallel polarity to the fixed layer) or "0" (i.e., parallel polarity to the fixed layer). One device having a fixed layer, a tunneling layer, and a free layer is a magnetic tunnel junction (MTJ). The electrical resistance of an MTJ is dependent on the magnetic polarity of the free layer compared to the magnetic polarity of the fixed layer. A memory device such as MRAM may be built from an array of individually addressable MTJs.

Conventionally, an MTJ contacts a first conductive line through a bottom electrode. The MTJ is positioned on the bottom electrode in a location distanced from the first conductive line. As explained above, the MTJ is formed by a MTJ material stack including a fixed layer that is positioned on the bottom electrode. A top electrode is formed on the free layer of the MTJ material stack. A critical challenge in MRAM technology is the patterning of the various layers forming the MTJ. Avoiding shorting around the MTJ requires the use of several dielectric and conductive layers. Conventional processing to form the MJT necessitates the use of several lithography masks and may be time-consuming.

Accordingly, it is desirable to provide integrated circuits and methods for fabricating integrated circuits that include MTJs that allow for more time-efficient manufacture. In addition, it is desirable to provide methods for fabricating integrated circuits that form an embedded bottom electrode structure for later connection to an MTJ structure in a maskless process. Furthermore, other desirable features and characteristics will become apparent from the subsequent detailed description and the appended claims, taken in conjunction with the accompanying drawings and the foregoing technical field and background.

BRIEF SUMMARY

Integrated circuits with MTJs and methods for fabricating integrated circuits with MTJ are provided. In an exemplary embodiment, a method for fabricating an integrated circuit includes forming a first conductive line in electrical connection with an underlying semiconductor device. The method exposes a surface of the first conductive line. Further, the method selectively deposits a conductive material on the surface of the first conductive line to form an electrode contact. The method includes forming a MTJ structure over the electrode contact.

In another embodiment, a method for fabricating an integrated circuit includes providing a semiconductor substrate including a semiconductor device. The method deposits an interlayer dielectric over the semiconductor substrate and forms a first conductive line in electrical connection with the semiconductor device. The method includes depositing a dielectric layer over the first conductive line and etching the dielectric layer to form a trench exposing the first conductive line. Further, the method includes forming an embedded bottom electrode structure in the trench in electrical contact with the first conductive line. Also, the method includes forming an MTJ structure over the embedded bottom electrode structure and a top electrode over the MTJ structure.

In another embodiment, an integrated circuit includes a semiconductor substrate having a semiconductor device formed thereon and/or therein. The integrated circuit includes an interlayer dielectric material overlying the semiconductor substrate and a conductive line embedded in the interlayer dielectric material and in conductive contact with the semiconductor device. The integrated circuit further includes a dielectric layer overlying the interlayer dielectric material and a bottom electrode structure embedded in the dielectric layer and in electrical contact with the conductive line. An MTJ structure lies over and is in in electrical contact with the bottom electrode structure. Also, a top electrode lies over and is in electrical contact with the MTJ structure.

BRIEF DESCRIPTION OF THE DRAWINGS

Embodiments of integrated circuits and methods for fabricating integrated circuits having MTJs will hereinafter be described in conjunction with the following drawing figures, wherein like numerals denote like elements, and wherein.

DETAILED DESCRIPTION

The following detailed description is merely exemplary in nature and is not intended to limit the various embodiments of the integrated circuits or the methods for fabricating the integrated circuits claimed herein. Furthermore, there is no intention to be bound by any expressed or implied theory presented in the preceding technical field, background or brief summary, or in the following detailed description. Also, additional components may be included in the integrated circuits, and additional processes may be included in the fabrication methods but are not described herein for purposes of clarity. For the purposes of explanation, numerous specific details are set forth in order to provide a thorough understanding of exemplary embodiments. It should be apparent, however, that exemplary embodiments may be practiced without these specific details or with an equivalent arrangement.

Methods for fabricating integrated circuits having MTJs as described herein provide increased fabrication efficiency as compared to conventional methods. Specifically, exemplary methods herein utilize selective deposition of a bottom electrode contact on an underlying conductive line. As a result, formation of the bottom electrode contact does not require a lithography process using mask deposition, mask patterning, and etching of bottom electrode contact material. In an exemplary embodiment, at least a portion of the bottom electrode structure is formed by electroless deposition on the underlying conductive line. Further, an exemplary integrated circuit provided herein includes a bottom electrode structure that is embedded in a dielectric layer. As a result, electrical connection to the bottom electrode structure is provided by an MTJ layer deposited over a planar surface formed by the embedded bottom electrode structure and the dielectric layer.

FIGS. 1-15 illustrate steps in accordance with various embodiments of methods for fabricating integrated circuits. Various steps in the design and composition of integrated circuits are well known and so, in the interest of brevity, many conventional steps will only be mentioned briefly herein or will be omitted entirely without providing the well-known process details. Further, it is noted that integrated circuits include a varying number of components and that single components shown in the illustrations may be representative of multiple components.

Figure 1:
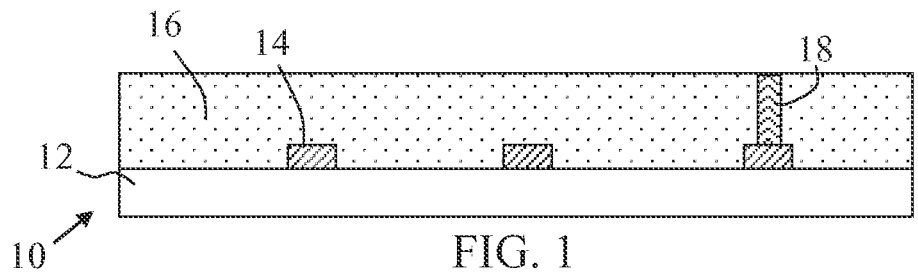
FIGS. 1-15 illustrate, in cross section, a portion of an integrated circuit and method steps for fabricating the integrated circuit with a magnetic tunnel junction MTJ in accordance with various embodiments herein.

Referring to FIG. 1, a method for fabricating an integrated circuit 10 generally includes providing a semiconductor substrate 12. The semiconductor substrate 12 is typically a silicon wafer and may also include other elementary semiconductor materials such as germanium. Alternatively, the semiconductor substrate 12 may include a compound semiconductor such as, silicon carbide, gallium arsenide, indium arsenide, or indium phosphide. Further, the semiconductor substrate 12 may optionally include an epitaxial layer (epi layer), may be strained for performance enhancement, and/or may include a silicon-on-insulator (SOI) structure. Further, the semiconductor substrate 12 may be formed into fin structures for use in FinFETs.

As shown, semiconductor devices 14, such as transistors, diodes, resistors, capacitors and the like, are formed in and/or overlying the semiconductor substrate 12 during typical front-end-of-line (FEOL) processing. As used herein "overlying" means "on" and "over". In this regard, the semiconductor devices 14 may lie directly on the semiconductor substrate 12 such that the semiconductor devices 14 make physical contact with the semiconductor substrate 12 or the semiconductor devices 14 may lie over the semiconductor substrate 12 such that another material layer is interposed between the semiconductor substrate 12 and the semiconductor devices 14. Further, as used herein, "overlying", "over", "bottom", "top", and "upper" describe the orientation and/or location of a feature or element within the consistent but arbitrary frame of reference illustrated by the drawings.

A dielectric material 16 is deposited over the semiconductor devices 14 and semiconductor substrate 12. The dielectric material 16 may be formed by chemical vapor deposition (CVD), spin-on, sputtering, or other suitable methods. The dielectric material 16 may include silicon oxide, silicon oxynitride, or a suitable low-k material. By "low-k," it is meant that the dielectric constant of a particular dielectric material is less than that of silicon dioxide. In an exemplary embodiment, the dielectric material 16 is tetraethyl orthosilicate oxide (TEOS). After the dielectric material 16 has been deposited, a via contact 18 may be formed in the dielectric material 16 in a "via middle" or "middle of the line" process. Specifically, a portion of the dielectric material 16 overlying a selected semiconductor device 14 is selectively removed to form a via recess that is then filled with a metal to form the via contact 18. In an exemplary embodiment, the dielectric material 16 is removed by patterning a photoresist film over the dielectric material 16 and performing a reactive ion etch (RIE) to remove the exposed dielectric material 16. Then, metal is deposited over the partially completed integrated circuit 10 to fill the via recess and form via contact 18. The metal may be deposited by physical vapor deposition (PVD) or another suitable process. An overburden of metal may be removed by planarization.

Figure 2:
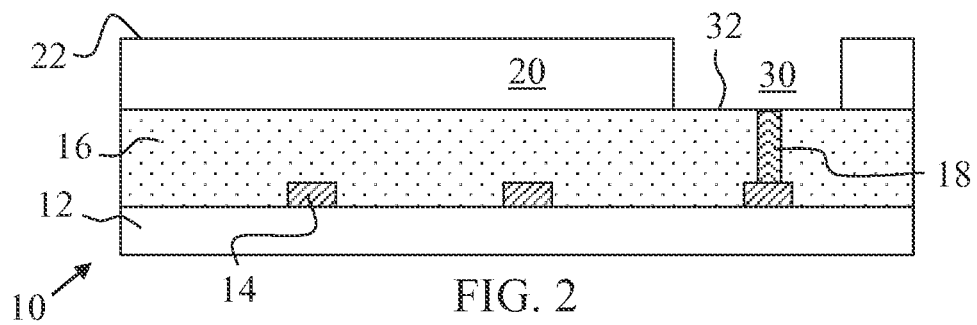

After the dielectric material 16 has been deposited and the via contacts 18 formed, the process may continue in FIG. 2 with depositing an interlayer dielectric 20. The interlayer dielectric 20 may be a low-k dielectric material or other suitable material. In an exemplary embodiment, the interlayer dielectric 20 is organosilicate glass (SiCOH). Exemplary processes for depositing the interlayer dielectric include chemical vapor deposition (CVD) and plasma enhanced chemical vapor deposition (PECVD). The interlayer dielectric 20 may be planarized to have a planar upper surface 22.

As shown in FIG. 2, the interlayer dielectric 20 is etched to define a trench 30 for use in the formation of an interconnect layer. The exemplary trench 30 has a bottom surface 32 that is formed by the dielectric material 16. In an exemplary embodiment, the interlayer dielectric 20 is removed by patterning a photoresist film over the interlayer dielectric 20 and performing a reactive ion etch (RIE) to remove the exposed interlayer dielectric 20. As shown, the exemplary etching process exposes the via contact 18 and provides for electrical connection to the via contact 18 as described below.

Figure 3:
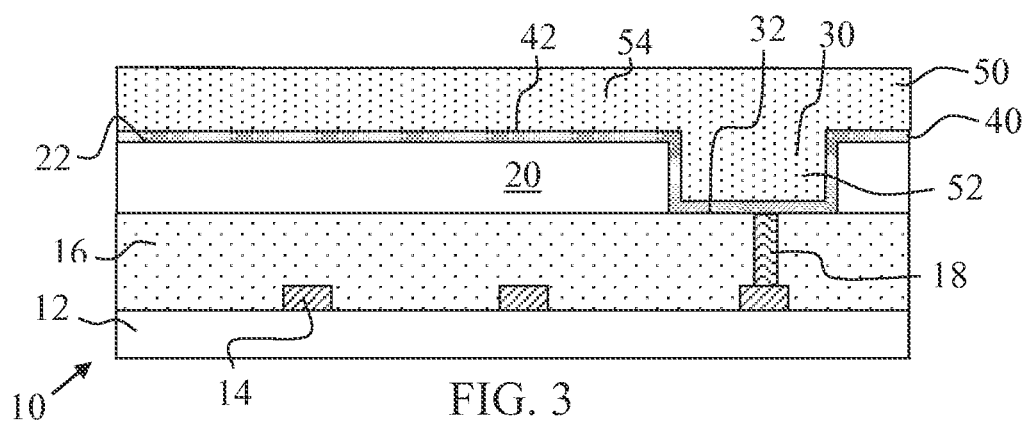

In FIG. 3, in an exemplary embodiment, the process continues by depositing a layer 40, such as a barrier layer, overlying the partially completed integrated circuit 10. As shown, the exemplary liner 40 is conformally deposited along the upper surface 22 of the interlayer dielectric 20, along the trench sidewalls, and along the bottom surface 32 of the trench 30 (the surface of the dielectric material 16 and device 18). The liner 40 may be formed from a transition metal and may include a stack of materials. An exemplary liner 40 includes an outer layer of tantalum nitride formed on the dielectric material 16 and interlayer dielectric 20 and an inner layer of tantalum formed on the outer layer; however, the liner 40 may be formed from any suitable material or materials that provide adequate adhesion to the interlayer dielectric 20 and prevent diffusion of the later-deposited fill metal into the interlayer dielectric 20. Each material in the liner 40 may be deposited by ionized physical vapor deposition (PVD), atomic layer deposition (ALD) or another suitable process.

As shown, the liner 40 includes a surface portion 42 lying over the upper surface 22 of the interlayer dielectric 20. A fill metal 50 is deposited over the liner 40 and includes a trench portion 52 that fills the trench 30 and an overburden portion 54 outside the trench 30 and overlying the surface portion 42 of the liner 40. The fill metal 50 may be any suitable metal that provides low resistance and withstands processing conditions. In an exemplary embodiment, the fill metal 50 is copper. The fill metal 50 may be deposited by sputtering, physical vapor deposition (PVD), atomic layer deposition (ALD), or other suitable methods.

Figure 4:
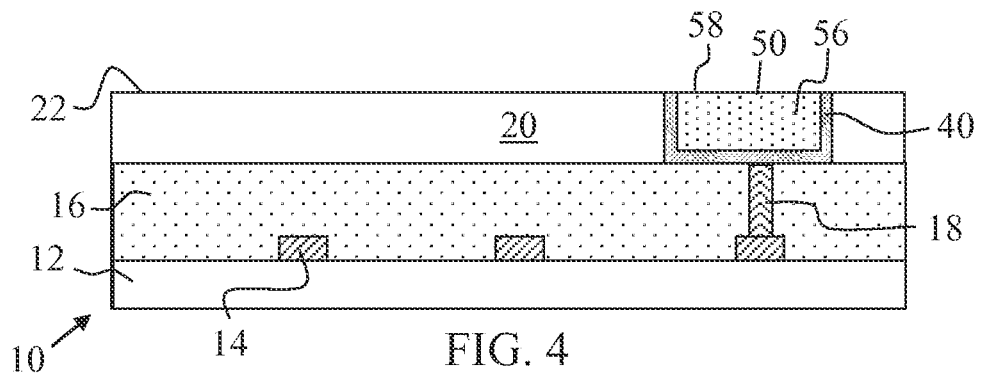

In FIG. 4, a chemical mechanical planarization (CMP) process removes the overburden portion 54 of the fill metal 50 and the surface portion 42 of the liner 40. As a result of the planarization process, a conductive line 56 is formed from the fill metal 50 and has an upper surface 58 that is substantially co-planar with the upper surface 22 of the interlayer dielectric 20.

While FIGS. 1-4 illustrate the electrical connection of a semiconductor device 14 to a single conductive line 56; the process of depositing dielectric layers, forming conductive lines in the dielectric layers, and electrically connecting newly formed conductive lines to underlying conductive lines can be repeated to obtain a desired number of layers of conductive lines, or metal layers. In an exemplary process, five or six conductive lines or metal layers are formed according to the processes described in relation to FIGS. 2-4. The following figures illustrate a single underlying conductive line 56 for purposes of clarity.

Figure 5:
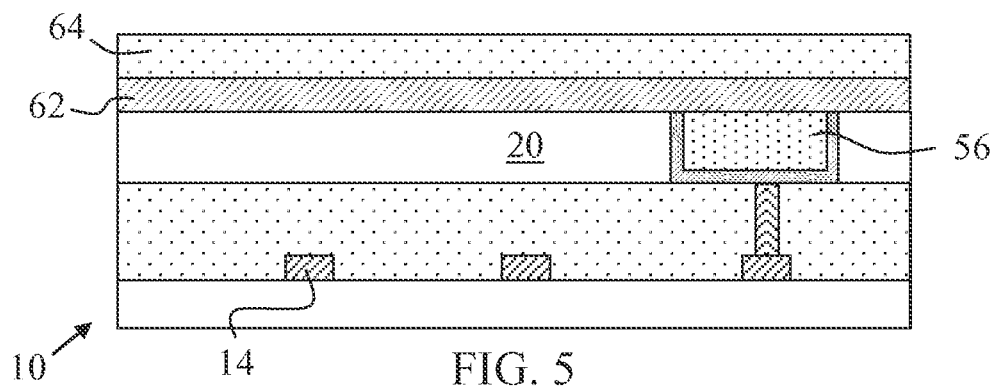

Referring to FIG. 5, the process of forming an MTJ structure over an underlying conductive line 56 is described. As shown, in an exemplary embodiment, a capping layer 62 is deposited over the interlayer dielectric layer 20 and the conductive line 56. An exemplary capping layer 62 is a non-oxide dielectric that prevents contact between the copper conductive line 56 and oxide, such as an overlying oxide dielectric layer. An exemplary capping layer 62 is silicon nitride or silicon carbide, such as a nitrogen-doped silicon carbide. An exemplary capping layer 62 has a thickness of from about 5 nanometers (nm) to about 20 nm. In an exemplary embodiment, the capping layer 62 is deposited by plasma enhanced chemical vapor deposition (PECVD).

A dielectric layer 64 is formed over the capping layer 62. The dielectric layer 64 provides sufficient distance between the underlying conductive line 56 and structures to be formed over the dielectric layer 64 to avoid electrical shorting or unwanted field effects during use. An exemplary dielectric layer 64 has a thickness of from about 10 nm to about 30 nm. The dielectric layer 64 may be formed by CVD, spin-on, sputtering, or other suitable methods. The dielectric layer 64 may include silicon oxide, silicon oxynitride, or a suitable low-k material. In an exemplary embodiment, the dielectric layer 64 is tetraethyl orthosilicate oxide (TEOS).

Figure 6:
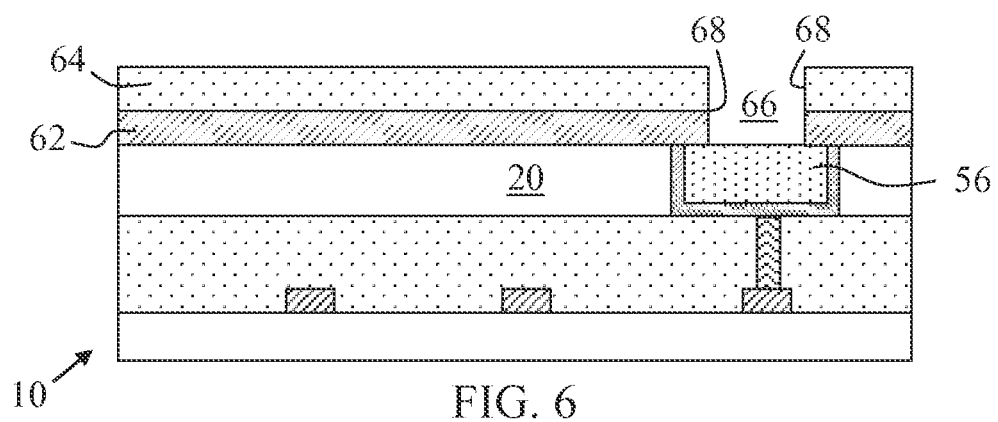

The exemplary method continues in FIG. 6 with a conductive line open process. Specifically, lithography masking and etching steps may be performed to form a trench 66 in the capping layer 62 and dielectric layer 64. The trench 66 is bounded by trench walls 68 formed by the capping layer 62 and dielectric layer 64. An exemplary trench 66 has a depth of from about 15 nm to about 50 nm. As shown, the trench 66 exposes a portion of the conductive line 56. In an exemplary embodiment, the dielectric layer 64 is removed by patterning a photoresist film over the dielectric layer 64 and performing a reactive ion etch (RIE) to remove the exposed dielectric layer 64. An exemplary RIE process is anisotropic. The RIE process used to remove the exposed portion of the dielectric layer 64 also may be used to remove the exposed portion of the underlying capping layer 62. Alternatively, a RIE process with a different chemistry may be used to anisotropically etch the capping layer 62. The RIE process that etches the capping layer 62 lands on the conductive line 56.

Figure 7:
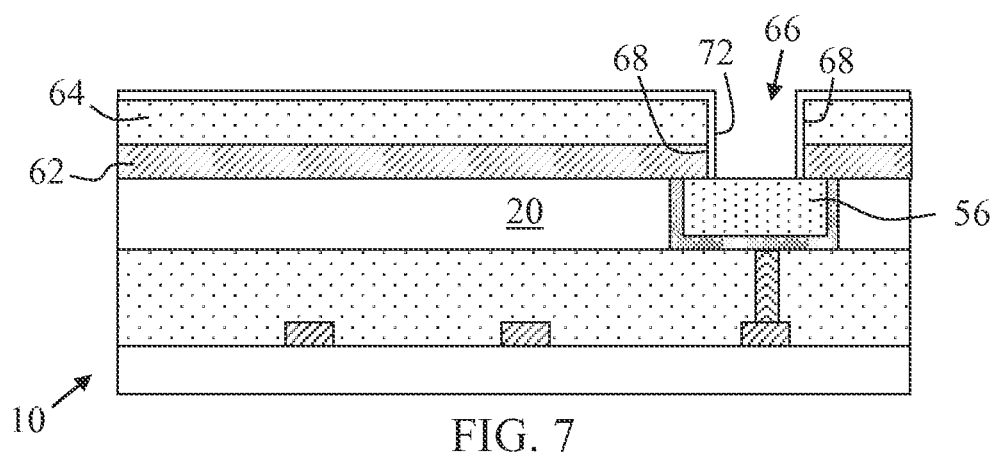

An optional step is illustrated in FIG. 7. As shown, a diffusion barrier layer 72 is formed over the dielectric layer 64 and capping layer 62. In an exemplary embodiment, the barrier layer 72 is formed by depositing a silicate-forming material over the dielectric layer 64, along the trench walls 68, and over the exposed portion of the conductive line 56. The integrated circuit 10 is annealed to cause a silication reaction to form a silicate barrier layer 72 along the upper surface of the dielectric layer 64 an along the trench walls 68 from reaction with the dielectric layer 64 and capping layer 62. Because the conductive line 56 does not contain silicon, no silicate is formed thereon and the deposited silicate-forming material may be removed from the conductive line 56 after the anneal process. An exemplary silicate-forming material is manganese. In an exemplary embodiment, a metal manganese film is formed by using a manganese compound gas, the metal manganese film is annealed in an oxidizing atmosphere, and the manganese silicate film is formed by annealing the metal manganese film in a reducing atmosphere after the annealing of the metal manganese film in the oxidizing atmosphere. Embodiments in which a copper bottom electrode structure is formed in the trench 66 may utilize the barrier layer 72 to prevent contact between copper and oxide layers to avoid diffusion of copper and electrical shorting. Embodiments in which a copper-free bottom electrode structure is formed in the trench 66 need not utilize the barrier layer 72.

Figure 8:
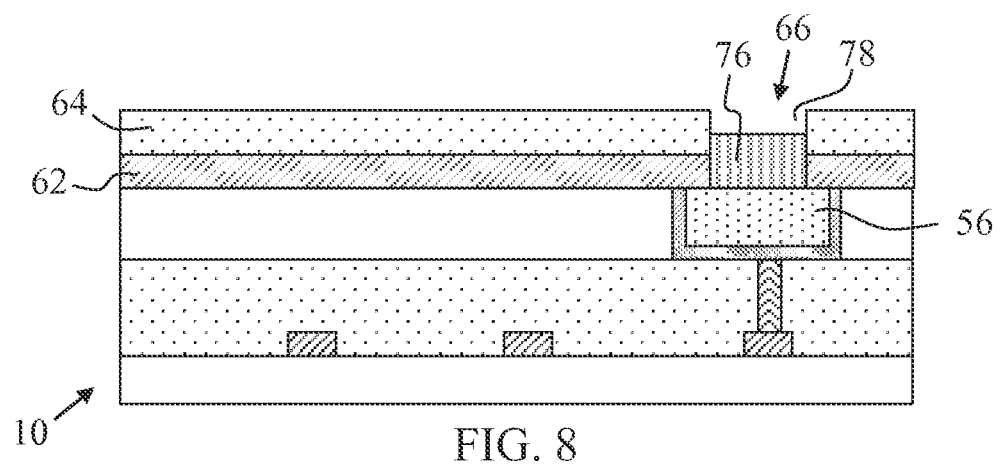

FIG. 8 illustrates further processing in the exemplary method. As shown, a bottom electrode contact 76 is formed in the trench 66 on the exposed portion of the conductive line 56. In an exemplary embodiment, the bottom electrode contact 76 is selectively formed on the conductive line 56 such that no masking of other components of the partially completed integrated circuit 10 is needed. For example, the bottom electrode contact 76 may be formed by an electroless deposition process. During an exemplary electroless deposition process, the partially completed integrated circuit 10 is immersed in a wet chemical bath including a reducing agent. When the reducing agent contacts the metal surface of the conductive line 56, the reducing agent reacts and deposits a metal. In an exemplary embodiment, the bath and reducing agent are selected to deposit nickel, a nickel alloy such as nickel boron alloy, cobalt, or a cobalt alloy such as cobalt tungsten upon contact with the conductive line 56.

In an exemplary embodiment, the bottom electrode contact 76 is formed with a thickness of from about 5 nm to about 40 nm. In FIG. 8, the bottom electrode contact 76 only partially fills the trench 66, leaving a remaining portion 78 of the trench 66 unfilled. An exemplary remaining portion of the trench 66 has a depth of about 10 nm to about 15 nm. In other embodiments, the bottom electrode contact 76 may completely fill the trench 66.

Figure 9:
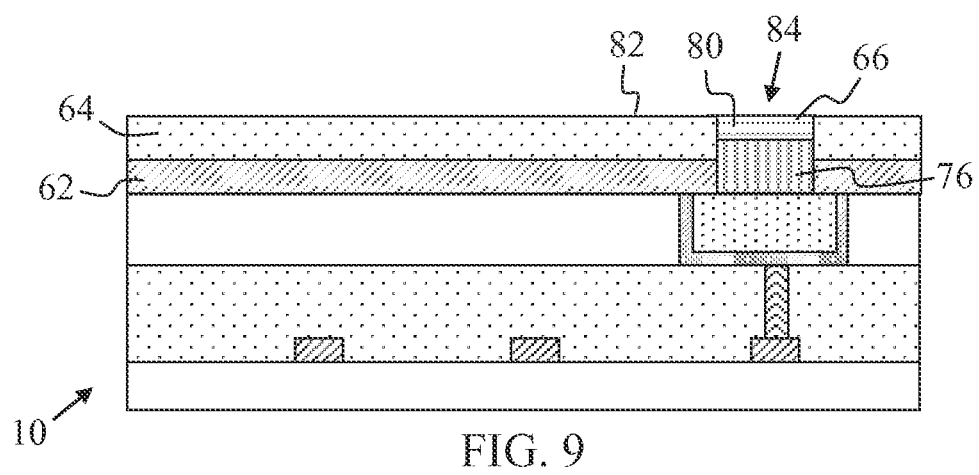

In FIG. 9, a bottom electrode material is deposited over the dielectric layer 64 and the bottom electrode contact 76 at a sufficient thickness to fill the remaining portion 78 of the trench 66. An exemplary bottom electrode material may be deposited to a thickness of from about 10 nm to about 30 nm. Typically, the bottom electrode material is deposited with an overburden portion outside of the trench 66. As shown, the bottom electrode material is planarized and the overburden portion of the bottom electrode material outside of the trench 66 is removed. As a result, a bottom electrode 80 is formed from the bottom electrode material in the trench 66 overlying the bottom electrode contact 76.

The bottom electrode 80 provides electrical connection to the bottom electrode contact 76 and serves as a pinning layer for the MTJ structure to be formed as explained below. An exemplary bottom electrode 80 can be formed from tantalum, tantalum nitride, a tantalum nitride/tantalum bilayer, tungsten or copper. As explained above, the barrier layer 72 is formed over the dielectric layer 64 and capping layer 62 for use with copper, including in the bottom electrode material, in the trench 66. In an exemplary embodiment, the bottom electrode 80 is conformally deposited by atomic layer deposition (ALD), physical vapor deposition (PVD), plasma enhanced chemical vapor deposition (PECVD), sputtering, or other suitable methods.

After planarization, the dielectric layer 64 and bottom electrode 80 form a planar surface 82. The bottom electrode 80 and bottom electrode contact 76 may be considered to collectively form a bottom electrode structure 84. As both the bottom electrode 80 and bottom electrode contact 76 are embedded in the dielectric layer 64, the bottom electrode structure 84 is formed as an embedded bottom electrode structure 84. While in FIG. 9 the bottom electrode structure 84 includes two components, the bottom electrode contact 76 and the bottom electrode 80, in certain embodiments the bottom electrode structure 84 may be formed from only one of the components 76 or 80.

Figure 10:
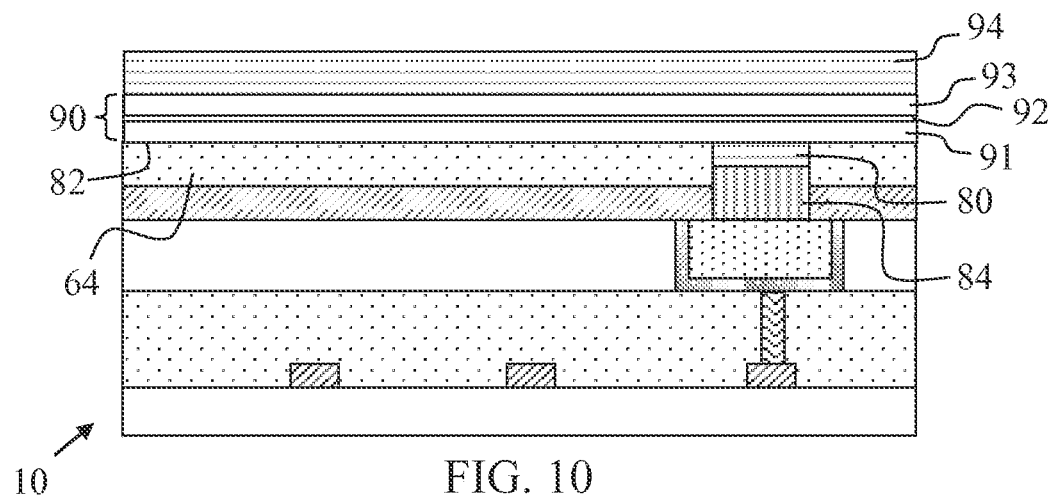

The exemplary method continues in FIG. 10 with the deposition of an MTJ forming layer 90 over the surface 82 of the dielectric layer 64 and the bottom electrode structure 84. An exemplary MTJ forming layer 90 has a thickness of from about 30 nm to about 70 nm. In an exemplary embodiment, the MTJ forming layer 90 includes a first magnetic layer 91 deposited over the bottom electrode structure 84, a thin insulating layer 92 deposited over the first magnetic layer 91, and a second magnetic layer 93 deposited over the thin insulating layer 92.

An exemplary first magnetic layer 91 includes a layer of tantalum nitride overlying a layer of nickel-iron alloy and optional additional magnetic layers. An exemplary first magnetic layer 91 has a thickness of about 15 nm to about 35 nm. The first magnetic layer 91 of the MTJ forming layer 90 is often referred to as a fixed layer because its magnetic polarization direction is fixed during device operation by the underlying bottom electrode 80 (or bottom electrode structure 84), which increases the coercive field of the fixed layer. An exemplary bottom electrode 80 (or bottom electrode structure 84) includes an anti-ferromagnetic layer that pins the magnetization of the fixed layer 91. In a typical two-component bottom electrode structure 84, the bottom electrode 80 pins the magnetization of fixed layer 91.

The thin insulating layer 92 of the MTJ forming layer 90 is referred to as the tunnel barrier or tunnel junction. An exemplary thin insulating layer 92 has a thickness of about 1 nm to about 2 nm. An exemplary thin insulating layer 92 is aluminum oxide. An exemplary second magnetic layer 93 of the MTJ forming layer 90 includes a layer of cobalt-iron alloy, a layer of ruthenium deposited over the cobalt-iron alloy, another layer of cobalt-iron alloy deposited over the layer of ruthenium, and optional additional magnetic layers. An exemplary second magnetic layer 93 has a thickness of about 15 nm to about 35 nm. The second magnetic layer 93 is referred to as a free layer because the magnetic polarization direction may rotate depending on the magnetic field, which is how information is written to or stored in the fabricated MRAM device of the integrated circuit 10.

In an exemplary embodiment, the MTJ forming layer 90 includes a stack including a layer of cobalt iron boron (CoFeB), a layer of magnesium oxide (MgO), and a layer of cobalt iron boron (CoFeB). In an exemplary embodiment, each layer is deposited by physical vapor deposition (PVD).

In FIG. 10, a top electrode material 94 is deposited over the MTJ forming layer 90. In an exemplary embodiment, the top electrode material 94 is tantalum, tantalum nitride, a tantalum nitride/tantalum bilayer, titanium, or titanium nitride. An exemplary top electrode material 94 has a thickness of about 10 nm to about 20 nm. In an exemplary embodiment, the top electrode material 94 is conformally deposited by atomic layer deposition (ALD), physical vapor deposition (PVD), plasma enhanced chemical vapor deposition (PECVD), sputtering, or other suitable methods.

Figure 11:
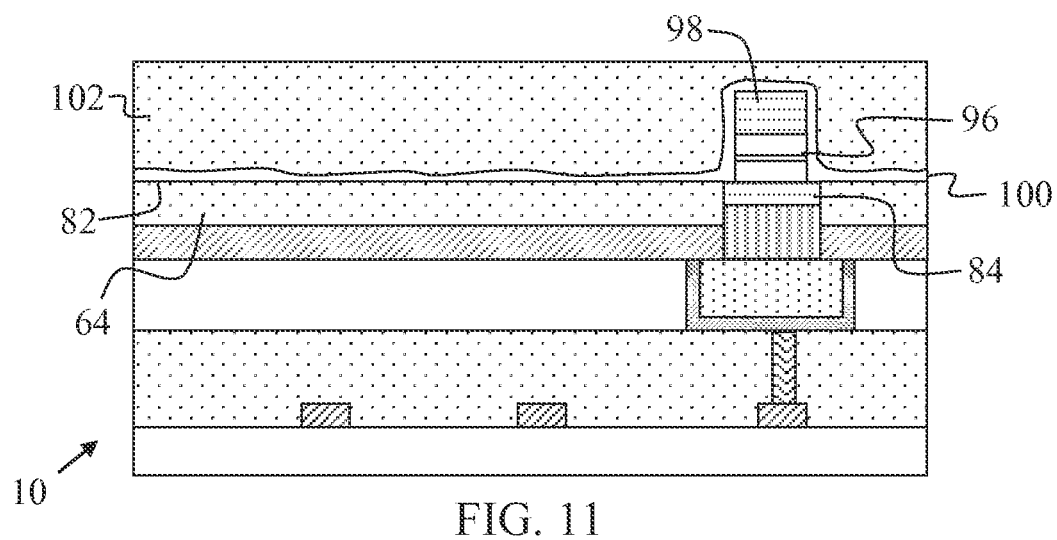

The exemplary method continues in FIG. 11 with etching the MTJ forming layer 90 and the top electrode material 94 to form a MTJ structure 96 and a top electrode 98, respectively. As shown, the MTJ structure 96 and top electrode 98 are formed with a width less than the width of the underlying bottom electrode structure 84, i.e., a portion of the surface 82 formed by the bottom electrode structure 84 is exposed by the etch forming the MTJ structure 96 and top electrode 98. The MTJ structure 96 and the underlying bottom electrode 80 are often collectively referred to as a magnetic tunnel junction (MTJ) stack.

In an exemplary embodiment, the MTJ forming layer 90 and the top electrode material 94 are etched using a conventional lithography masking and etching process. For example, a hard mask layer (not shown) may be deposited over the top electrode material 94 and patterned using a photoresist mask stack. Then, portions of the MTJ forming layer 90 and the top electrode material 94 exposed by the hard mask layer are selectively etched.

After forming the MTJ structure 96 and the top electrode 98, the exemplary method performs an in situ passivation process. Specifically, a passivation barrier layer 100 is conformally deposited over the surface 82 of the dielectric layer 64 and bottom electrode structure 84, MTJ structure 96, and top electrode 98. An exemplary passivation barrier layer 100 is silicon carbide or silicon nitride. Typically, the passivation barrier layer 100 is provided as a very dense film for protecting against penetration by moisture or other species. The exemplary passivation barrier layer 100 encapsulates, passivates and protects the MTJ stack. Furthermore, the exemplary passivation barrier layer 100 is also a dielectric barrier that can be used as an etch stop in CMOS processing, such as during the fabrication of logic circuitry in subsequent back-end-of-line ("BEOL") processes.

The exemplary method continues with the formation of a dielectric material 102 over the passivation barrier layer 100. The dielectric material 102 may be formed by chemical vapor deposition (CVD), spin-on, sputtering, or other suitable methods. The dielectric material 102 may include silicon oxide, silicon oxynitride, or a suitable low-k material. In an exemplary embodiment, the dielectric material 102 is tetraethyl orthosilicate oxide (TEOS).

Figure 12:
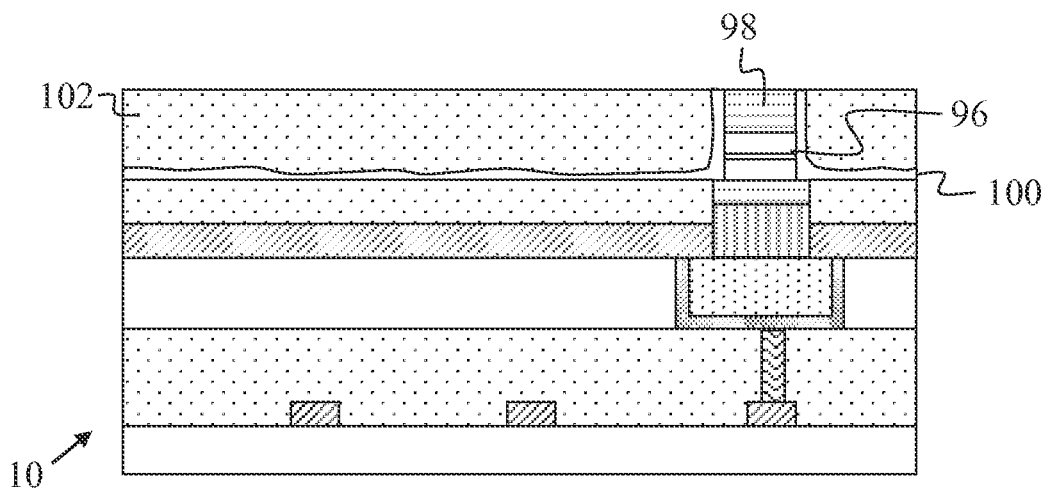
Figure 13:
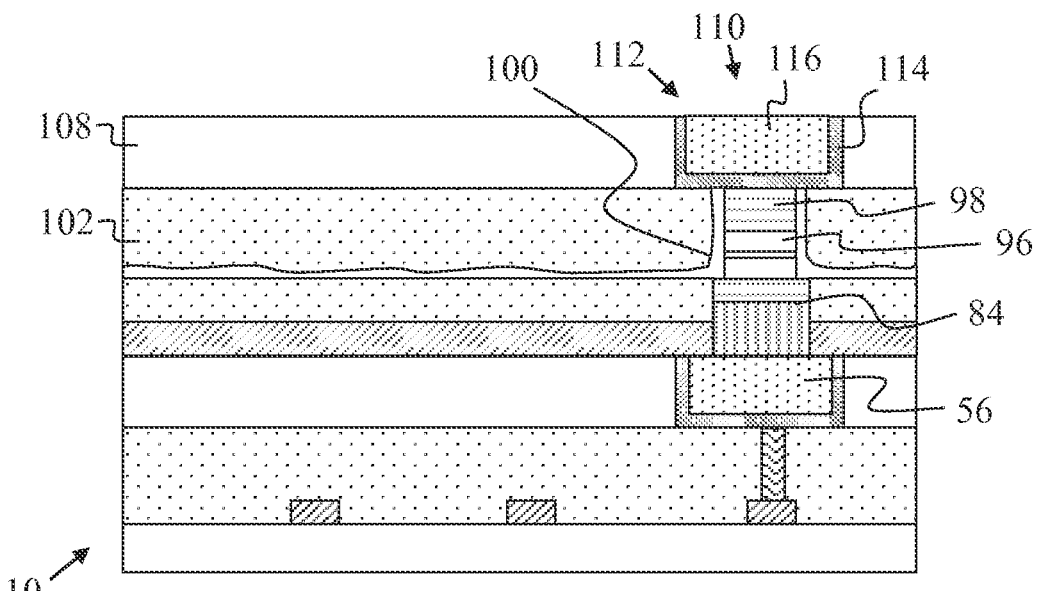

In FIG. 12, the dielectric material 102 and passivation barrier layer 100 are planarized, such as by a chemical mechanical planarization (CMP) process. The planarization process lands on and exposes the top electrode 98. Thereafter, as shown in FIG. 13, an interlayer dielectric 108 is deposited over the dielectric material 102, passivation barrier layer 100 and top electrode 98. The interlayer dielectric 108 may be a low-k dielectric material or other suitable material. In an exemplary embodiment, the interlayer dielectric 108 is organosilicate glass (SiCOH). Exemplary processes for depositing the interlayer dielectric include chemical vapor deposition (CVD) and plasma enhanced chemical vapor deposition (PECVD). The interlayer dielectric 108 may be planarized.

As further shown in FIG. 13, the interlayer dielectric 108 is etched to define a trench 110 for use in the formation of another interconnect layer. The exemplary trench 110 has a bottom surface formed by the dielectric material 102, passivation barrier layer 100 and top electrode 98. In an exemplary embodiment, the trench 110 is formed by patterning a photoresist film over the interlayer dielectric 108 and performing a reactive ion etch (RIE) to remove the exposed interlayer dielectric 108. Formation of the trench 110 exposes the top electrode 98 to provide for electrical connection to the top electrode 98.

An upper conductive line 112 is formed in the trench 110 in electrical contact with the top electrode 98. As shown, the upper conductive line 112 may include a barrier layer 114 and a fill metal 116. An exemplary liner 114 is conformally deposited over the interlayer dielectric 108 and the exposed dielectric layer 102, passivation barrier layer 100 and top electrode 98. The liner 114 may be formed from a transition metal and may include a stack of materials. An exemplary liner 114 includes an outer layer of tantalum nitride and an inner layer of tantalum; however, the liner 114 may be formed from any suitable material or materials that provide adequate adhesion to the interlayer dielectric 108 and prevent diffusion of the fill metal 116 into the interlayer dielectric 108. Each material in the liner 114 may be deposited by ionized physical vapor deposition (PVD), atomic layer deposition (ALD) or another suitable process. The fill metal 116 is deposited over the liner 114. The fill metal 116 may be any suitable metal that provides low resistance and withstands processing conditions. In an exemplary embodiment, the fill metal 116 is copper. The fill metal 116 may be deposited by sputtering, physical vapor deposition (PVD), atomic layer deposition (ALD), or other suitable methods. In FIG. 13, a chemical mechanical planarization (CMP) process removes overburden portions of the fill metal 116 and the liner 114. As a result of the planarization process, the upper conductive line 112 formed from the fill metal 116 and liner 114 has an upper surface substantially co-planar with the upper surface of the interlayer dielectric 108.

FIGS. 1-13 illustrate the fabrication of an MTJ structure 96 between a bottom electrode structure 84 electrically connected to an underlying conductive line 56 and a top electrode 98 electrically connected to an overlying conductive line 112. The exemplary method described requires fewer masking processes than conventional processes as it forms the embedded bottom electrode structure 84 using a maskless selective bottom electrode contact formation in a trench, and maskless deposition and removal by planarization of the bottom electrode material.

Figure 14:
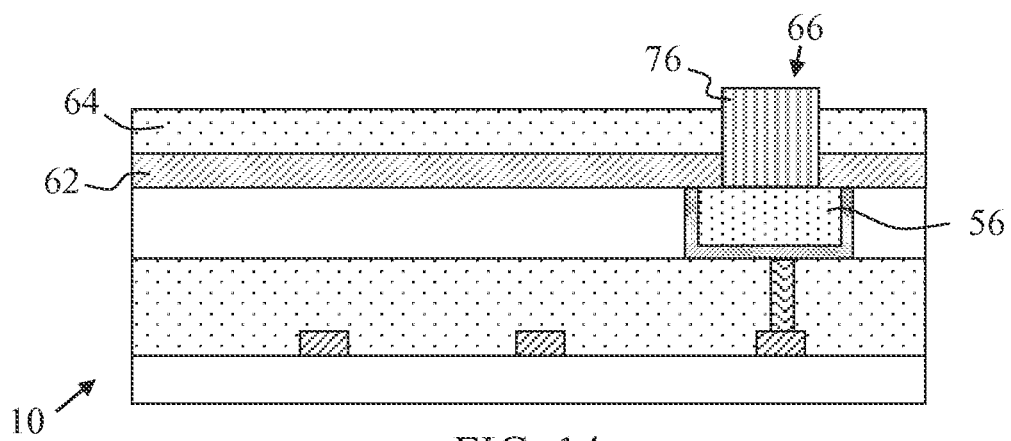
Figure 15:
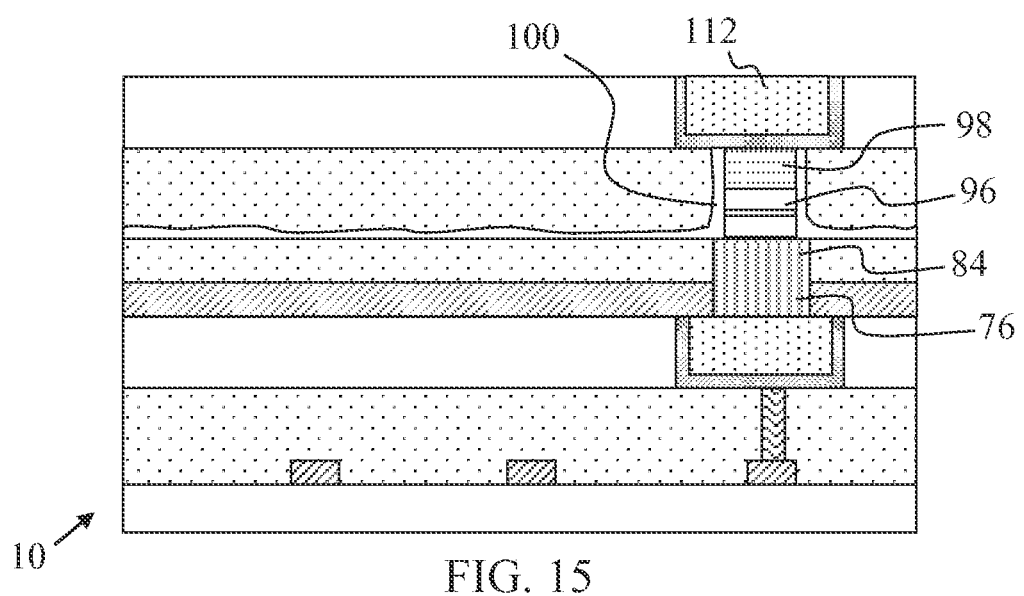

FIGS. 14-15 illustrate an embodiment in which the bottom electrode structure 84 is formed from a single component: the bottom electrode contact 76. FIG. 14 processes the structure of FIG. 6 (or FIG. 7 if utilizing a copper bottom electrode contact 76). In FIG. 14, a bottom electrode contact formation process completely fills the trench 66 shown in FIG. 6. In an exemplary embodiment, the bottom electrode contact 76 is formed with a thickness of from about 25 nm to about 60 nm. The bottom electrode contact 76 overfills the trench 66 and forms an overburden portion outside the trench.

As shown, the bottom electrode contact 76 is formed in the trench 66 on the exposed portion of the conductive line 56. In an exemplary embodiment, the bottom electrode contact 76 is selectively formed on the conductive line 56 such that no masking of other components of the partially completed integrated circuit 10 is needed. For example, the bottom electrode contact 76 is formed by an electroless deposition process. During an exemplary electroless deposition process, the partially completed integrated circuit 10 is immersed in a wet chemical bath including a reducing agent. When the reducing agent contacts the metal surface of the conductive line 56, the reducing agent reacts and deposits a metal. In an exemplary embodiment, the bath and reducing agent are selected to deposit nickel, a nickel alloy such as nickel boron alloy, cobalt, or a cobalt alloy such as cobalt tungsten upon contact with the conductive line 56.

In FIG. 15, the overburden portion of the bottom electrode contact 76 is removed by planarization, such as by CMP. As a result, the embedded bottom electrode structure 84 is formed from the bottom electrode contact 76. Steps for the formation of the MTJ structure 96, top electrode 98, passivation barrier layer 100 and contact line 112 are then performed as described in relation to FIGS. 10-13 resulting in the integrated circuit 10 shown in FIG. 15.

The integrated circuit fabrication methods described herein provide for integrated circuits with MTJs while minimizing the use of lithography masking steps to provide more efficient processing. Embedded bottom electrode structures are formed using selective deposition processes, such as electroless deposition. The processes for forming MTJs described herein may be employed at various conductive lines or metal layers during BEOL processing for integrated circuit fabrication.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for fabricating an integrated circuit, the method comprising:
   forming a first conductive line in electrical connection with an underlying semiconductor device;
   depositing a dielectric layer having an upper surface over the first conductive line;
   exposing a surface of the first conductive line, wherein exposing the surface of the first conductive line comprises etching a trench into the dielectric layer and forming trench sidewalls therein;
   depositing manganese on the upper surface and trench sidewalls and forming a manganese silicate barrier layer;
   selectively depositing a conductive material on the surface of the first conductive line to form an electrode contact; and
   forming a magnetic tunnel junction (MTJ) structure directly over the electrode contact.

2. The method of claim 1 wherein forming the magnetic tunnel junction (MTJ) structure directly over the electrode contact comprises depositing a bottom electrode on the electrode contact and depositing a magnetic layer on the bottom electrode.

3. The method of claim 2 wherein selectively depositing the conductive material on the surface of the first conductive line comprises selectively depositing the conductive material in the trench, wherein depositing the bottom electrode on the electrode contact comprises depositing the bottom electrode in the trench, and wherein depositing the magnetic layer on the bottom electrode comprises depositing the magnetic layer on the upper surface of the dielectric layer.

4. The method of claim 3 wherein the magnetic layer includes a selected portion on the bottom electrode and a non-selected portion on the dielectric layer, and wherein forming the magnetic tunnel junction (MTJ) structure directly over the electrode contact further comprises removing the non-selected portion of the magnetic layer.

5. The method of claim 1 wherein selectively depositing the conductive material on the surface of the first conductive line comprises selectively depositing the conductive material in the trench, and wherein forming the magnetic tunnel junction (MTJ) structure directly over the electrode contact comprises depositing a bottom electrode on the electrode contact and in the trench; and wherein the method further comprises planarizing the bottom electrode to remove any portion of the bottom electrode outside of the trench and to form an electrode surface co-planar with a surface of the dielectric layer.

6. The method of claim 5 wherein forming the magnetic tunnel junction (MTJ) structure directly over the electrode contact comprises forming a planar MTJ layer on the bottom electrode and on the surface of the dielectric layer.

7. The method of claim 1 wherein selectively depositing the conductive material on the surface of the first conductive line comprises filling the trench with the conductive material, and wherein the method further comprises planarizing the conductive material to remove any portion of the conductive material outside of the trench and to form a conductive material surface co-planar with a surface of the dielectric layer, wherein forming the magnetic tunnel junction (MTJ) structure directly over the electrode contact comprises depositing a magnetic layer on the conductive material surface and on the surface of the dielectric layer.

8. The method of claim 1 wherein selectively depositing the conductive material on the surface of the first conductive line comprises selectively depositing copper in the trench.

9. The method of claim 1 wherein forming the magnetic tunnel junction (MTJ) structure on the electrode contact comprises:
depositing an MTJ layer over the electrode contact;
depositing a top electrode layer over the MTJ layer; and
patterning the MTJ layer and the top electrode layer to form the MTJ structure directly over the electrode contact.

10. The method of claim 1 wherein forming the magnetic tunnel junction (MTJ) structure directly over the electrode contact comprises:
depositing an MTJ layer over the electrode contact;
depositing a top electrode layer over the MTJ layer; and
patterning the MTJ layer and the top electrode layer to form the MTJ structure; and wherein the method further comprises:
depositing a passivation layer over the MTJ structure;
depositing an interlayer dielectric over the passivation layer;
planarizing the interlayer dielectric and the passivation layer to expose the top electrode; and
forming a second conductive line in electrical contact with the top electrode.

11. A method for fabricating an integrated circuit, the method comprising:
providing a semiconductor substrate including a semiconductor device;
depositing an interlayer dielectric over the semiconductor substrate;
forming a first conductive line in electrical connection with the semiconductor device;
depositing a dielectric layer over the first conductive line;
etching the dielectric layer to form a trench exposing the first conductive line;
forming an embedded bottom electrode structure in the trench in electrical contact with the first conductive line;
planarizing the embedded bottom electrode structure to form an electrode surface co-planar with a surface of the dielectric layer; and
forming a magnetic tunnel junction (MTJ) structure over the embedded bottom electrode structure and a top electrode over the MTJ structure, wherein forming the magnetic tunnel junction (MTJ) structure over the embedded bottom electrode structure comprises depositing an MTJ layer on the surface of the bottom electrode structure and on the surface of the dielectric layer.

12. The method of claim 11 wherein forming the embedded bottom electrode structure in the trench comprises:
depositing a bottom electrode contact in the trench; and
depositing a bottom electrode in the trench over the bottom electrode contact.

13. The method of claim 12 wherein:
depositing the bottom electrode contact in the trench comprises depositing cobalt, a cobalt alloy, nickel or a nickel alloy in the trench; and
depositing the bottom electrode in the trench comprises depositing tantalum in the trench over the bottom electrode contact.

14. The method of claim 11 wherein the trench is bounded by trench walls formed from the dielectric layer, and wherein forming the embedded bottom electrode structure in the trench comprises:
forming a barrier layer on the trench walls;
depositing a bottom electrode contact in the trench; and
depositing a bottom electrode in the trench over the bottom electrode contact.

15. The method of claim 14 wherein:
forming the barrier layer on the trench walls comprises depositing manganese on the trench walls and forming a manganese silicate barrier layer;
depositing the bottom electrode contact in the trench comprises depositing copper in the trench; and
depositing the bottom electrode in the trench over the bottom electrode contact comprises depositing tantalum over the bottom electrode contact.

16. The method of claim 11 wherein forming the embedded bottom electrode structure in the trench comprises filling the trench with a bottom electrode contact.

17. The method of claim 16 wherein filling the trench with the bottom electrode contact comprises filling the trench with cobalt, cobalt alloys, nickel or nickel alloys.

18. An integrated circuit comprising:
a semiconductor substrate having a semiconductor device formed thereon and/or therein;
an interlayer dielectric material overlying the semiconductor substrate;
a conductive line embedded in the interlayer dielectric material and in conductive contact with the semiconductor device;
a dielectric layer overlying the interlayer dielectric material and having an upper surface;
a bottom electrode structure embedded in the dielectric layer and in electrical contact with the conductive line, wherein the bottom electrode structure has an upper surface co-planar with the upper surface of the dielectric layer;
a magnetic tunnel junction (MTJ) structure overlying and in electrical contact with the bottom electrode structure;
a passivation layer overlying the MTJ structure and in contact with the upper surface of the bottom electrode structure and the upper surface of the dielectric layer; and
a top electrode overlying and in electrical contact with the MTJ structure.

\* \* \* \* \*